United States Patent [19]

Imanaka et al.

[11] Patent Number: 4,839,307

[45] Date of Patent: Jun. 13, 1989

[54] METHOD OF MANUFACTURING A STRIPE-SHAPED HETEROJUNCTION LASER WITH UNIQUE CURRENT CONFINEMENT

[75] Inventors: Koichi Imanaka, Kyoto; Hiroshi Imamoto, Takatsuki, both of Japan

[73] Assignee: Omron Tateisi Electronics Co., Kyoto, Japan

[21] Appl. No.: 48,616

[22] Filed: May 11, 1987

[30] Foreign Application Priority Data

May 14, 1986 [JP] Japan .............................. 61-108652
Mar. 10, 1987 [JP] Japan .............................. 62-52964

[51] Int. Cl.$^4$ ........................ H01L 33/00; H01S 3/19
[52] U.S. Cl. ......................... 437/129; 148/DIG. 41; 148/DIG. 56; 148/DIG. 72; 148/DIG. 95; 437/167; 437/183; 437/112; 437/970; 437/951; 156/612; 357/17; 372/46
[58] Field of Search ................ 148/DIG. 29, 34, 41, 148/56, 65, 72, 95, 146, 169; 372/45, 46, 48; 156/610-614; 357/16, 17; 437/107, 91, 105, 129, 126, 133, 93, 112, 970

[56] References Cited

U.S. PATENT DOCUMENTS

| | | | |
|---|---|---|---|
| 4,251,298 | 2/1981 | Thompson | 437/130 |
| 4,545,057 | 10/1985 | Hayakawa et al. | 372/45 |
| 4,567,060 | 1/1986 | Hayakawa et al. | 437/129 |
| 4,595,454 | 6/1986 | Dautremont-Smith et al. | 357/17 |
| 4,599,787 | 7/1986 | Sasatoni | 357/16 |
| 4,635,268 | 1/1987 | Motegi et al. | 372/45 |
| 4,639,925 | 1/1987 | Kurihara et al. | 372/46 |
| 4,701,926 | 3/1986 | Seiwa et al. | 372/48 |

FOREIGN PATENT DOCUMENTS

| | | | |
|---|---|---|---|
| 0011690 | 1/1984 | Japan | 437/129 |
| 0057989 | 4/1985 | Japan | 437/129 |

OTHER PUBLICATIONS

M. Asai et al., "Semiconductor Laser of Internal Current Restriction Type by MBE Single-Step Growth" the 4th Semiconductor Laser Symposium Yokoshu, p. 12, Feb. 24, 1987.
H. Imamoto et al., "P-Type GaAs: Si Growth on V-Shaped Groove by MBE and it's Application to LD (Inner-Striped Laser Diode by a Novel Single Step MBE" the 34th Oyo Butsurigaku Kankei Rengo Koenkai Koen Yokoshu, vol. 1, p. 204 (#31p-ZA-4), Mar. 31, 1987.
K. Imanaka et al., "Inner-Stripe AlGaAs/GaAs Laser Diode by Single-Step Molecular Beam Epitaxy" Electronics Letters, vol. 23, No. 5, pp. 209-210—Feb. 26, 1987.
W. I. Wang et al.—"Crystal Orientation Dependence of Silicon Doping in Molecular Beam Epitaxial AlGaAs/GaAs Heterostructures" Appl. Phys. Lett. 47(8), Oct. 15, 1985.
D. L. Miller et al., "Lateral p-n Junction Formation in GaAs Molecular Beam Epitaxy by Crystal Plane Dependent Doping" Appl. Phys. Lett. 47(12), Dec. 15, '82.
S. Yamamoto et al., "Visible GaAlAs V-Channeled Substrate Inner Stripe Laser with Stabilized Mode Using p-GaAs Substrate" Appl. Phys. Lett. 40(5)—Mar. 1, 1982.
Parker, "The Technology and Physics of Molecular Beam Epitaxy", Plenum Press, New York, N.Y., Sep. 1985, pp. 126, 132—133, 476-487.
Ballingall et al., "Crystal Orientation Dependence of Silicon Autocompensation in Molecular Beam Epitaxial Galliums Arsenide," Appl. Phys. Lett. 41(10), Nov. 15, 1982, pp. 947-949.

Primary Examiner—Brian E. Hearn
Assistant Examiner—William Bunch
Attorney, Agent, or Firm—Stevens, Davis, Miller & Mosher

[57] ABSTRACT

A semiconductor laser having an internal current restriction includes a (100) face-oriented p-type GaAs substrate treated to have a groove or difference in level having an (n11) A face (n=1-5) as an inclined surface. An AlGaAs: Si layer, an AlGaAs:Be cladding layer, an AlGaAs active layer, and an AlGaAs:Sn cladding layer are grown on the substrate in the order mentioned. Since the Si acts as an n-type material on the (100) face and as a p-type material on the (n11) face, the AlGaAs:Si layer becomes a p-type layer solely in the groove, and it is in this portion that a current path is formed. The laser can be fabricated by molecular-beam epitaxy applied in a single step.

6 Claims, 3 Drawing Sheets

METHOD OF MANUFACTURING A STRIPE-SHAPED HETEROJUNCTION LASER WITH UNIQUE CURRENT CONFINEMENT

BACKGROUND OF THE INVENTION

This invention relates to a semiconductor manufacturing method and, more particularly, to a method of manufacturing a semiconductor laser having an internal current restriction by using e.g. molecular-beam epitaxy.

A conventional AlGaAs/GaAs semiconductor laser having an internal current restriction is manufactured by growing a layer of one conductivity type on a substrate of the opposite conductivity type by a first crystal growth step, etching away a portion of this layer in a stripe-shaped configuration, and growing a double heterojunction on the substrate in a second crystal growth step in such a manner that the stripe can be provided with a current path.

However, problems with this conventional semiconductor laser manufacturing method are that the crystal growth step is required to be performed twice, and flaws tend to develop at the interface of the first and second growths, which serves as a reverse bias current blocking layer, since the substrate is exposed to high temperatures at the time of the second growth step.

SUMMARY OF THE INVENTION

Accordingly, an object of the present invention is to provide a method of manufacturing a semiconductor laser which does not require the crystal growth step to be performed twice, especially a semiconductor laser of the type having an internal current restriction portion or inner stripe.

According to a first aspect of the present invention, the foregoing object is attained by providing a method of manufacturing a semiconductor laser comprising the steps of forming a stripe-shaped groove or incline exposing an (n11) (n=1-5) A face on a (100) face-oriented p-type GaAs substrate or GaAs substrate having a (100) face-oriented p-type GaAs layer as a surface layer, growing Si-doped GaAs or AlGAs thereon by molecular-beam epitaxy, and providing thereon a double heterojunction structure having an n-type cladding layer in the form of tin-doped AlGaAs.

Thus, a semiconductor laser having an internal current restriction can be fabricated by a single crystal growth step, in which laser only the A face portion is of p-type conductivity, with the remaining flat portion being of n-type conductivity. This solves the aforementioned problems of the prior art.

According to a second aspect of the present invention, the aforementioned object is attained by providing a method of manufacturing a semiconductor laser comprising the steps of forming a stripe-shaped groove or inclination exposing an (n11) (n=1-3) A surface on a (100) face-oriented p-type GaAs substrate or GaAs substrate having a (100) face-oriented p-type GaAs layer as a surface layer, growing Si-doped GaAs or AlGAs thereon by molecular-beam epitaxy, and providing thereon a double heterojunction structure having an n-type cladding layer in the form of an Si-doped AlGaAs layer and a cap layer in the form of Sn-doped GaAs.

Thus, a semiconductor laser having an internal current restriction can be fabricated by a single crystal growth step, in which laser only the A face portion is of p-type conductivity, the remaining flat portion is of n-type conductivity, and the internal current restriction is formed at the central portion of the groove or difference in level. This solves the aforementioned problems of the prior art. In particular, since a narrow flat portion can be formed at the central portion of the n-type cladding layer, the flat portion serves as an n-type area flanked on both sides by inclined surfaces of p-type conductivity, thereby forming a narrow current restriction for electrons.

DESCRIPTION OF THE PREFERRED EMBODIMENTS

Figure 1:
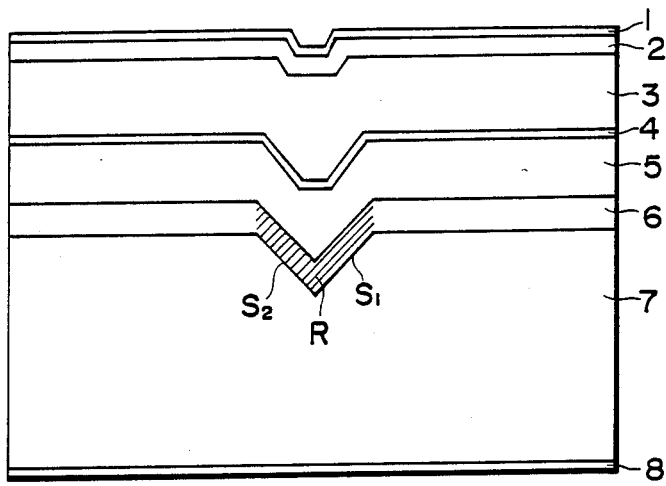
FIG. 1 is a sectional view illustrating a semiconductor laser manufactured in accordance with a first method of the present invention.

FIG. 1 is a conceptual view of a semiconductor laser manufactured in accordance with a first manufacturing method of the invention. The laser is shown in cross section taken perpendicular to the direction of resonance.

The semiconductor laser of FIG. 1 includes an n-side electrode 1, an n+-GaAs contact layer 2, an n-type $Al_xGa_{1-x}As$ cladding layer 3 having tin (Sn) as a dopant, an active layer 4, a p-type $Al_yGa_{1-y}As$ cladding layer 5 having beryllium (Be) as a dopant, a silicon (Si)-doped $Al_zGa_{1-z}As$ current restriction layer 6, a (100) face-oriented p-type GaAs substrate 7, and a p-side electrode 8.

The above semiconductor laser is manufactured in the following manner: First, an etching mask having a stripe-shaped window in the $(0\bar{1}1)$ direction is provided on the (100) face-oriented p-type GaAs substrate 7, and a groove which will expose an (n11) (n=1-5) A face, as indicated at $S_1$, $S_2$, is formed by wet chemical etching using sulfuric acid-hydrogen peroxide-water or by dry etching.

After the etching mask is removed, the Si-doped AlGaAs layer 6, the Be-doped AlGaAs layer 5, the active layer 4, which is of AlGaAs type, the Sn-doped AlGaAs layer 3, and the n-type GaAs layer 2 are grown successively in the order mentioned by molecular-beam epitaxy (MBE). Lastly, the electrodes 1, 8 are provided.

When Si is used as the doping material at growth of the current restriction layer 6, the Si acts as an n-type material on the (100) face and as a p-type material on the (n11) face, as is well-known. Therefore, the layer 6 is of the p-type inside the groove formed by etching and of the n-type in the flat portions externally of the groove. As a result, the interface of the layers 5 and 6 constitutes a reverse bias current blocking layer at the flat portion, so that a current flows only within the groove. In FIG. 1, the p-type portion is the region R, which is indicated by the hatched portion.

In contrast to the above, Sn is used as an n-type dopant in the n-type cladding layer 3 in order to avoid this conductivity inverting effect.

When an electric current is passed from the p-side electrode 8 toward the n-side electrode 1 in the above-described structure, the current is concentrated efficiently at the central portion of the active layer 4 through the aforementioned groove R, so that the device operates as an internal current restriction-type semiconductor laser.

Figure 2:
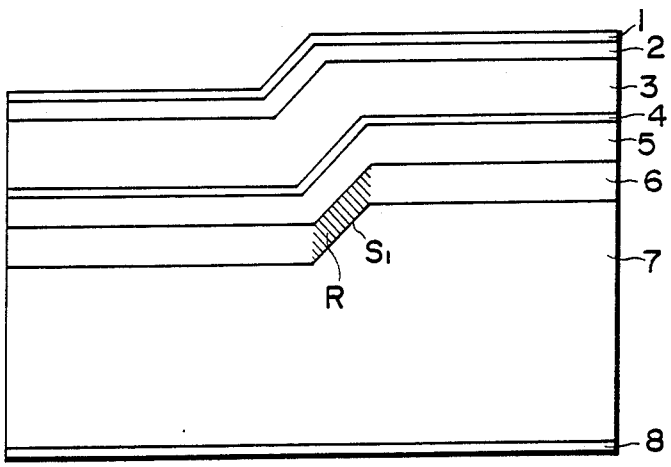
FIG. 2 is a sectional view illustrating a semiconductor laser manufactured in accordance with a method which is a minor modification of th first method.

FIG. 2 illustrates a semiconductor laser manufactured by a method in which etching forms an inclined surface rather than a groove. This is a so-called "terrace-type" semiconductor laser. Portions similar to those shown in FIG. 1 are designated by like reference characters.

In the laser of FIG. 2, the (100) face-oriented p-type GaAs substrate 7 is subjected to terrace etching to provide the substrate with an (n11) A face (n=1-5) in the form of an inclined surface. This is followed by growing the layers 6, 5, 4, 3, 2 on the substrate in the order mentioned.

In accordance with the invention as set forth above, an internal current restriction-type semiconductor laser can be fabricated through a single crystal growth step by appropriate selection of the dopant.

Though not discussed in detail hereinabove, the active layer 4 can be a single layer of $Al_wGa_{1-w}As$ or can be of a multiquantum well structure or so-called GRIN-SCH (graded index separate confinement heterostructure).

Figure 3:
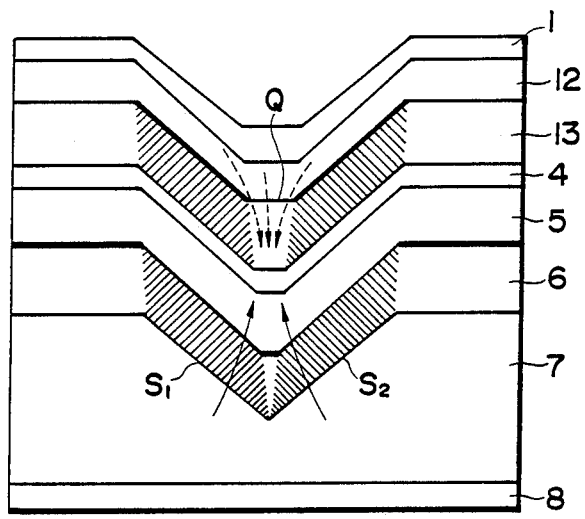
FIG. 3 is a sectional view illustrating a semiconductor laser manufactured in accordance with a second method of the present invention.

FIG. 3 is a conceptual view of a semiconductor laser manufactured in accordance with a second manufacturing method of the invention. The laser is shown in cross section taken perpendicular to the direction of resonance. Portions similar to those shown in FIG. 1 are designated by like reference characters.

The semiconductor laser of FIG. 3 includes a tin (Sn)-doped n-type $Al_xGa_{1-x}As$ contact layer 12, and an n-type $Al_xGa_{1-x}As$ clading layer 13 having silicon (Si) as a dopant and acting as a current restriction layer from the electron injection direction.

The semiconductor laser of FIG. 3 is manufactured in the following manner: First, an etching mask having a stripe-shaped window in the $(0\bar{1}1)$ direction is provided on the (100) face-oriented p-type GaAs substrate 7, and a groove which will expose an (n11) (n=1-3) A face, as indicted at $S_1$, $S_2$, is formed by wet chemical etching using phosphoric acid-hydrogen peroxide-water or by dry etching.

After the etching mask is removed, the Si-doped AlGaAs layer 6, the Be-doped AlGaAs layer 5, the active layer 4, which is of AlGaAs type, the Si-doped AlGaAs layer 13, and the n-type GaAs layer 12 are grown successively in the order mentioned by molecular beam epitaxy (MBE). Lastly, the electrodes 1, 8 are provided.

When Si is used as the doping material at growth of the current restriction layer 6 and n-type cladding layer 13, the Si acts as an n-type material on the (100) face and as a p-type material on the (n11) face, as mentioned above. Therefore, the current restriction layer 6 is of the p-type inside the groove formed by etching since almost all of this portion defines an inclined surface. The p-type portion in layer 6 is indicated by the hatched areas. The layer 6 is of the n-type in the flat portions externally of the groove. Since the n-type cladding layer 13 is produced on the layers 5, 4 formed on layer 6, flatness increases at the central portion (indicated at Q) of the groove in cladding layer 13, so this portion is of n-type conductivity. The inclined surfaces flanking this flat portion are of p-type conductivity (indicated by the hatched areas in layer 13), and the flat portions on both sides are of n-type conductivity.

Accordingly, at the interface of layers 5 and 6, the flat portions on both sides of the groove serve as a reverse bias current blocking layer with respect to positive holes. At the interface of layers 12, 13, moreover, the inclined surface portions flanking the central flat portion Q form a reverse bias current blocking layer with respect to electrons. In FIG. 3, the pn reverse bias junction surface is indicated by the bold lines.

In contrast to the above, Sn is used as an n-type dopant in the n-type contact layer 12 in order to avoid this conductivity inverting effect.

Figure 5:
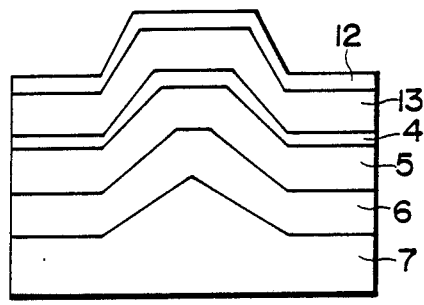
Figure 6:
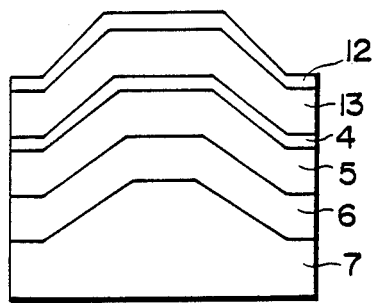

When a current (positive holes) is passed from the p-side electrode 8 toward the n-side electrode 1 in the above structure, the positive holes from the electrode 8 flow toward the central portion of the active layer 4 through the inclined surface portions of the layer 6, as indicated by the solid-line arrows, and electrons from the electrode 1 flow toward the central portion of the active layer 4 solely through the central flat portion Q of the layer 13 to recombine the positive holes, whereby oscillation of the laser occurs. Thus, electric current is concentrated efficiently at the central portion of the active layer 4, so that the device operates as an internal current restriction-type semiconductor laser FIGS. 4 through 6 illustrate other embodiments of the invention.

Figure 4:
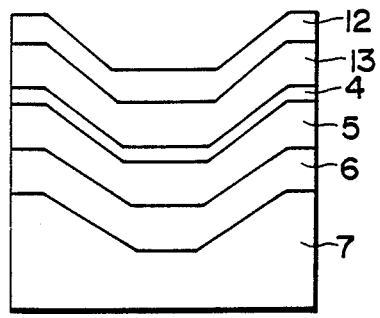
FIGS. 4, 5 and 6 are sectional views illustrating semiconductor lasers manufactured in accordance with methods which are minor modifications of the second method.

FIG. 4 illustrates a semiconductor laser manufactured by leaving a flattened bottom in a groove by an etching technique. FIG. 5 shows a semiconductor laser manufactured by performing etching in such a manner that upwardly convex layers are formed. FIG. 6 depicts a semiconductor laser manufactured by a process which leaves a (100) flat surface on the crest of a convexity. In FIGS. 4 through 6, portions similar to those shown in FIG. 3 are designated by like reference characters; note, however, that the electrodes 1, 8 are not shown. In these embodiments, the (100) face-oriented p-type GaAs substrate 7 is subjected to terrace etching to provide the substrate with an (n11) A face (n=1-3) in the form of an inclined surface. This is followed by growing the layers 6, 5, 4, 13, 12 on the substrate in the order mentioned.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing a semiconductor laser having an internal current restriction, comprising the steps of:
   (a) forming a groove or difference in level exposing an (n11) (n=1-5) A face on a (100) face-oriented p-type GaAs substrate or GaAs substrate having a (100) face-oriented p-type GaAs layer as a surface layer;
   (b) growing Si-doped AlGaAs or GaAs layer thereon; and
   (c) providing thereon a double heterojunction structure having an n-type cladding layer in the form of tin-doped AlGaAs.

2. The method according to claim 1, wherein said step (a) includes placing an etching mask having a window on the (100) face-oriented p-type GaAs substrate or GaAs substrate having the p-type GaAs layer as a surface layer, and forming said groove by etching away an underlying surface through said window.

3. The method according to claim 1, wherein said step (b) is performed by molecular-beam epitaxy.

4. A method of manufacturing a semiconductor laser having an internal current restriction, comprising the steps of:

(a) forming a groove or difference in level exposing an (n11) (n=1-3) A face on a (100) face-oriented p-type GaAs substrate or GaAs substrate having a (100) face-oriented p-type GaAs layer as a surface layer;

(b) growing Si-doped AlGaAs or GaAs layer thereon;

(c) providing thereon a double heterojunction structure having an n-type cladding layer in the form of an Si-doped AlGaAs layer; and (d) further providing an n-type cap layer.

5. The method according to claim 4 wherein said step (a) includes placing an etching mask having a window on the (100) face-oriented p-type GaAs substrate or GaAs substrate having the p-type GaAs layer as a surface layer, and forming said groove by etching away an underlying surface through said window.

6. The method according to claim 4 wherein said step (b) is performed by molecular-beam epitaxy.

* * * * *